United States Patent [19]

Adam

[11] Patent Number: 4,503,342
[45] Date of Patent: Mar. 5, 1985

[54] LOW POWER PUSH-PULL CMOS DRIVER CIRCUIT

[75] Inventor: Fritz G. Adam, Freiburg, Fed. Rep. of Germany

[73] Assignee: ITT Industries, Inc., New York, N.Y.

[21] Appl. No.: 444,013

[22] Filed: Nov. 23, 1982

[30] Foreign Application Priority Data

Dec. 17, 1981 [EP]  European Pat. Off. ........... 81110521

[51] Int. Cl.³ .................. H03K 19/094; H03K 19/20; H03K 17/30
[52] U.S. Cl. .................................... 307/475; 307/450; 307/451; 307/585
[58] Field of Search ............................... 365/184, 190; 307/200 B, 443, 450, 451, 475, 246, 572, 577, 579, 585, 264, 270

[56] References Cited

U.S. PATENT DOCUMENTS

| | | | |
|---|---|---|---|
| 3,631,528 | 12/1971 | Green | 307/451 X |
| 4,090,258 | 5/1978 | Cricchi | 365/184 |
| 4,217,502 | 8/1980 | Suzuki et al. | 307/473 |
| 4,313,065 | 1/1982 | Yoshida et al. | 307/585 |
| 4,424,456 | 1/1984 | Shiraki et al. | 307/451 X |

Primary Examiner—John S. Heyman
Assistant Examiner—David R. Hudspeth
Attorney, Agent, or Firm—James B. Raden; Edward J. Brosius

[57] ABSTRACT

The control power input of a power stage designed in the form of a CMOS inverter can be considerably reduced according to the invention in that, with the aid of a driver stage splitting the digital input signal, each of the two gate electrodes of the two field-effect transistors of the power stage, are simultaneously but separately controlled by each time one driver signal of the same polarity, thus each time raising the source-gate voltage of one of the two field-effect transistors above its threshold voltage value.

2 Claims, 18 Drawing Figures

$$Pg' = f\ Cg\ (U3-U0)^2$$

$$Pg = f\ Cg^2 \cdot [(U1-U0)^2 + (U3-U2)^2]$$

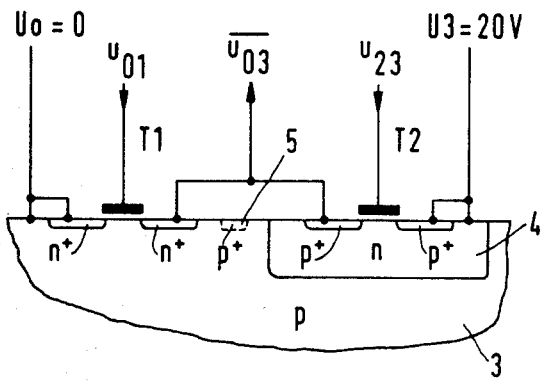
FIG. 4a
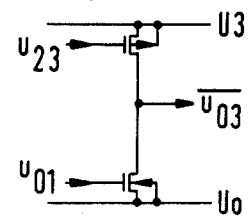
FIG. 4b
FIG. 4c
| $u_{01}$ Volt | $u_{23}$ Volt | $\overline{u_{03}}$ Volt |
|---|---|---|
| 0 | 15 | 20 |
| 5 | 20 | 0 |
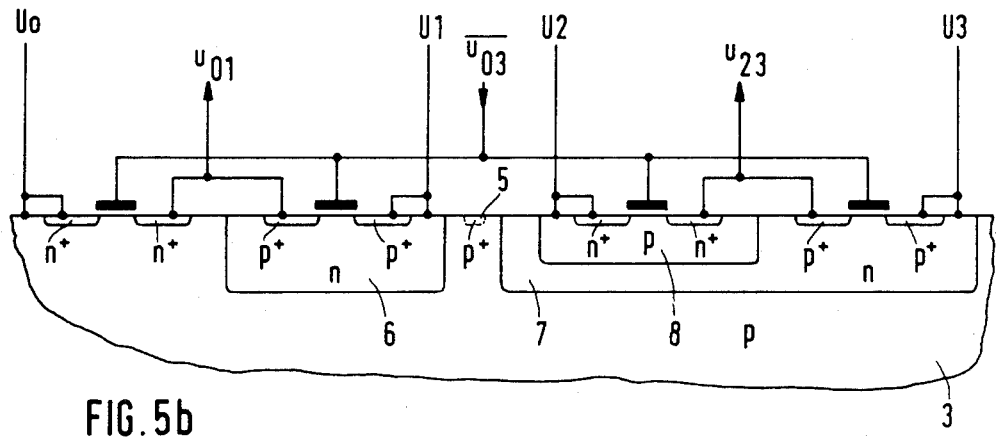
FIG. 5a
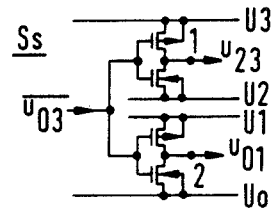
FIG. 5b
$U_o = 0$
$U_1 = 5V$
$U_2 = 15V$
$U_3 = 20V$
FIG. 5c
| $\overline{u_{03}}$ Volt | $u_{01}$ Volt | $u_{23}$ Volt |
|---|---|---|
| 0 | 5 | 20 |
| 20 | 0 | 15 |

FIG. 6a
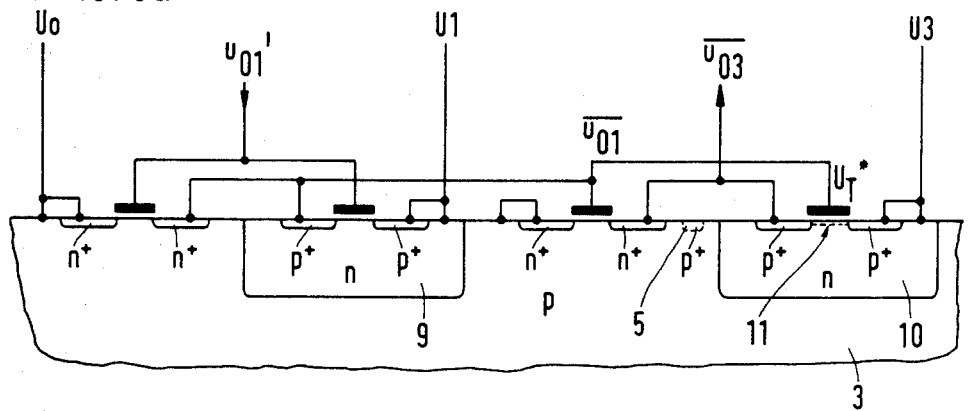
FIG. 6b
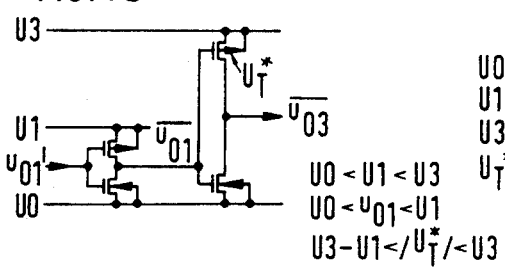
FIG. 6c
$U0 = 0$
$U1 = 5V$
$U3 = 20V$
$U_T^* = -16V$
$U0 < U1 < U3$
$U0 < u_{01} < U1$
$U3-U1 </U_T^*/< U3$
| $u_{01}'$ Volt | $\overline{u_{01}}$ Volt | $\overline{u_{03}}$ Volt |
|---|---|---|
| 0 | 5 | 0 |
| 5 | 0 | 20 |
FIG. 7a
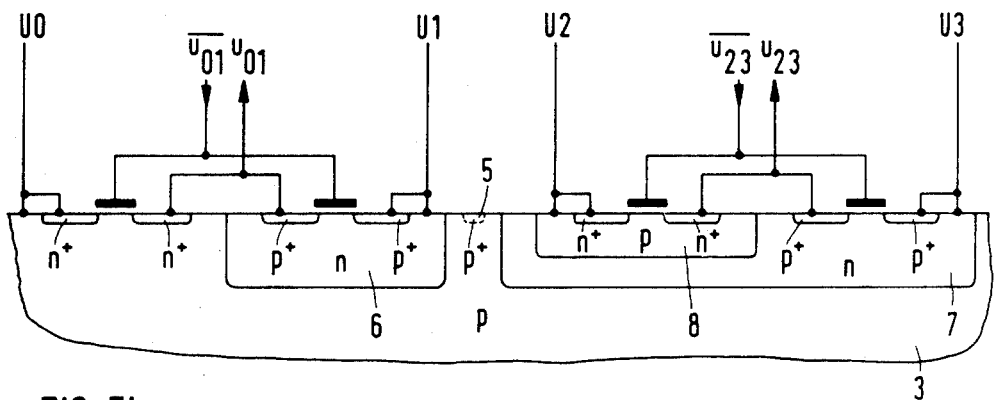
FIG. 7b
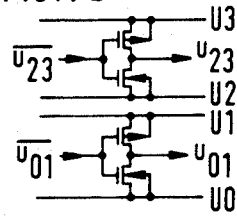
FIG. 7c
$U0 = 0$
$U1 = 5V$
$U2 = 15V$
$U3 = 20V$
| $\overline{u_{01}}$ Volt | $u_{01}$ Volt | $\overline{u_{23}}$ Volt | $u_{23}$ Volt |
|---|---|---|---|
| 5 | 0 | 20 | 15 |
| 0 | 5 | 15 | 20 |

$$c_{01} = \overline{\overline{a_{01}} + b_{01}} = a_{01} \cdot \overline{b_{01}}$$
$$c_{23} = \overline{\overline{a_{23}} + b_{23}} = a_{23} \cdot \overline{b_{23}}$$
$$\overline{c_{03}} = \overline{a_{01}} + b_{01} = \overline{a_{01} \cdot \overline{b_{01}}}$$

LOW POWER PUSH-PULL CMOS DRIVER CIRCUIT

BACKGROUND OF THE INVENTION

CMOS circuits offer two main advantages over circuits manufactured in accordance with the single-channel technology:

(1) Their standby power dissipation is mostly negligibly small because it is only caused by inverse currents.

(2) They are capable of providing at the output a very-low ohmic voltage source for operating a useful load.

These two advantages add towards the fact that CMOS circuits can be preferably used also with higher operating voltages. The power dissipation of the output transistors operating in a source circuit can be kept very small and almost independent of the voltage, by a large W/L ratio also under load conditions.

The drive power $P_g$, as required at the gate electrodes of the output transistors, increases as the square of the increasing operating voltage $U_B$, and, especially in the case of a high gate capacity $$C_g = W \cdot L \cdot C_{ox}$$

with W=channel width, L=channel length, Cox=specific capacity, and at a high frequency f, may have disturbing effects:

$$P_g = f\, C_g\, U_B^2.$$

This drive power also appears when at the output there is not required a useful power, but merely a high voltage. This, for example, applies to the case of a peripheral circuit for the programming of nonvolatile storing field-effect memory transistors of a storage matrix, as is known, for example, from the European Patent Application (EP-OS) No. 00 20 054.

In the case of such a storage matrix, the drive power required for the programming is distributed to a plurality of transistors. In the case of a 16k-matrix storage employing n-channel floatinggate cells, organized in 128 rows and 128 columns, there will probably be concerned e.g., 128 switching transistors whose gate electrodes have to be momentarily switched to a programming voltage of about 20 V.

SUMMARY OF THE INVENTION

It is now the object of the invention, with respect to such a circuit which is intended for higher voltages, in which the drive power reaches a non-acceptable magnitude, or the realization of which is prohibited owing to the drive power, to provide a solution which substantially reduces the drive power.

The invention is based on the idea to realize such circuits which are intended for relatively high voltages, for reducing the power dissipation, first of all in accordance with the CMOS technology, i.e. by employing gates comprising complementary insulated-gate field-effect transistors.

The invention relates to an integrated CMOS circuit as is known, for example, from the technical journal "Elektronik" (1972), No. 4, pp. 111 to 116.

According to the basic idea of the invention, and in distinction to the prior art, the input signal is not applied to the gate electrodes which are connected to one another, but separately via a driver stage which serves to produce two driver signals of the same sign, which are simultaneously applied to each time one gate electrode of the complementary field-effect transistors, and each time raise the source-gate voltage of one of the two field-effect transistors above its threshold value. Since the threshold voltages of the field-effect transistors can be chosen to be very low, merely relatively low voltages are required for switching the integrated CMOS circuit.

DESCRIPTION OF THE DRAWINGS

FIG. 4a shows a section of a CMOS gate for use with the CMOS circuit according to the invention.

FIG. 4b shows a schematic diagram for the gate of FIG. 4a.

FIG. 4c is a table showing applied voltages in FIG. 4a.

FIG. 5a shows a section of a monolithic integration of a drive stage.

FIG. 5b is a circuit diagram of FIG. 5a.

FIG. 5c is a table showing the applied voltages of FIG. 5a.

FIG. 6a shows a section of a monolithic integrated level conversion circuit. FIG. 6b is a circuit diagram of FIG. 6a.

FIG. 6c is a table showing the operating data for FIG. 6b.

FIG. 7a shows a section of a monolithic integrated circuit for inverting separated driver signals.

FIG. 7b is a circuit diagram for FIG. 7a.

FIG. 7c is a table showing the operating data for FIG. 7b.

DESCRIPTION OF THE INVENTION

Figure 1:
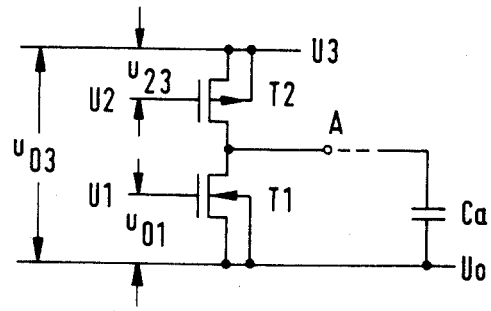
FIGS. 1 to 3 are schematic diagrams that serve to explain differences of the integrated CMOS circuit according to the invention with respect to a conventional circuit.

The CMOS gate as shown in FIG. 1 differs from a conventional CMOS gate in that the gate electrodes of the two field-effect transistors T1 and T2, according to the basic idea of the inventon, are not connected to one another.

Figure 2:
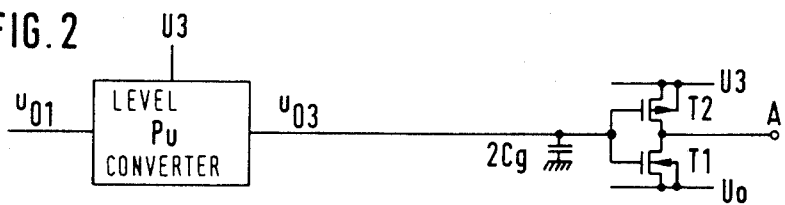
Figure 3:
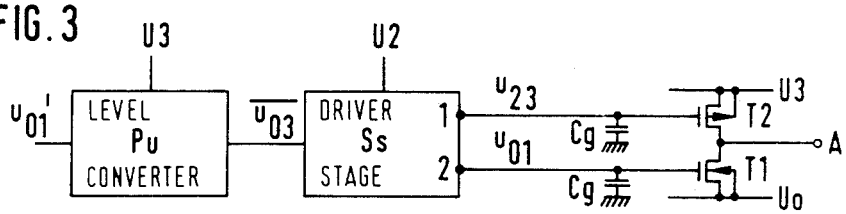

The block diagrams as shown in FIGS. 2 and 3 serve to compare the solution according to the prior art as shown in FIG. 2 with that according to the invention as shown in FIG. 3. It is started out from the fact that according to the prior art, in a preceding circuit at first the control signals $u_{O1}$ or $u_{O1}'$ are produced at a lower voltage level U1 and, only thereafter, and as much as possible directly before producing the effective signal $u_{O3}$ or $u_{O3}$, to change over to the high voltage U3 by way of a level conversion with the aid of the level converter Pu. Cg indicates a gate capacitance while Ca according to FIG. 1 indicates a capacitive load connected to the output A, as is the case when selecting word lines of a storage matrix employing non-volatile readable field-effect memory transistors.

While the CMOS circuit as shown in FIG. 2 according to the prior art, the control signal $u_{O3}$ is directly used for recharging the selection capacitance 2Cg, the circuit according to the invention as shown in FIG. 3 uses a driver stage Ss which serves to split the input signal $u_{O3}$ into the two driver signals $u_{23}$ and $u_{O1}$ as appearing at the two outputs 1 or 2 and are applied to the gate electrodes of each of the two fieldeffect transistors T1 and T2 respectively.

Whereas in the CMOS circuit as shown in FIG. 2, there is effected a recharging of the capacitance 2Cg between U3 and U0, the gate capacitance Cg of the field-effect transistor T2, in the CMOS circuit as shown in FIG. 3, is recharged between U3 and U2, and that of the field-effect transistor T1, between U1 and U0. In a practical example of embodiment suitable for supplying a word line of a storage matrix employing n-channel floating-gate memory transistors, the following voltage values are assumed:

$U0 = 0$      $U2 = 15V$ $U1 = 5V$      $U3 = 20V$

Accordingly, the following applies to the driver signals at the outputs of the driver stage Ss in the turned-on stage:

$u_{01}(1) = U1 - U0 = 5V$ $u_{23}(1) = U3 - U2 = 5V$ whereas the control signal, without a splitting, with respect to the case as shown in FIG. 2, would amount to $u_{O3}(1) = U3 - U0 = 20V$.

Accordingly, the control power dissipations Pg' and Pg as indicated by the terms shown below FIGS. 2 and 3, are as follows:

$Pg/Pg' = 400/25 = 16/1$.

FIG. 4, with respect to the examples U0=0 and U3=20V, illustrates the potential or voltage ratios of a CMOS gate to which the two driver signals $u_{O1}$ and $u_{23}$ are applied. FIG. 4a in the usual cross sectional view, shows the two substrate regions 3 and 4 in which the regions of the complementary field-effect transistors T1 and T2 are accommodated. FIG. 4b shows the corresponding circuit diagram, and FIG. 4c, in the form of a table, shows the voltages $u_{O1}$ and $u_{23}$ as appearing at the two inputs, as well as the voltage $u_{O3}$ as appearing at the output of the gate.

The connection between the source regions of the two field-effect transistors is established in accordance with the prior art, in the form of a stripline extending over the surface layer of silicon dioxide as not shown in the sectional view. Below this stripline, in the surface of the substrate region 3, there is provided a highly doped channel interrupter region 5 preventing the formation of a parasitic channel. Relative thereto it is to be noted that with the CMOS gate as used with the integrated CMOS circuit according to the invention, a channel interrupter region is merely required below this stripline between the two source regions, as is recognizable from FIG. 4c. Because only here there appears a relatively high voltage difference of 20V, while this voltage difference, in the case of the leads to the gate electrodes 65 which are likewise designed as striplines on the surface of the silicon dioxide layer, merely amounts to 5V. Accordingly, since with the striplines between the driver stage Ss and the output stage as shown in FIG. 4, there are not required any highly doped channel interrupter regions of the same conductivity type as the adjoining substrate region, there will result from this the advantage of a saving in surface area.

FIG. 5 shows the preferred embodiment of the driver stage Ss of the integrated CMOS circuit according to the invention. In FIG. 5a, in the usual cross-sectional representation, and as part of a monolithic integrated solid-state circuit, there is shown the monolithic integration of the driver stage, with the corresponding circuit diagram thereof being shown in FIG. 5b. This is accommodated in a p-doped, plate-shaped semiconductor body on one surface side, used as the substrate region 3. Planar substrate regions 6, 7 and 8 are diffused into this side of the surface, with the substrate region 8 being inserted in the substrate region 7, and all substrate regions being electrically insulated from one another with respect to direct current, by a pn junction area.

As can be easily recognized from FIG. 5b, the driver stage Ss consists of two CMOS inverters each with a pair of complementary insulated-gate field-effect transistors to the gate electrodes of which the input signal $u_{O3}$ is applied. The first output 1 of the driver stage Ss is connected to the output of the first CMOS inverter, with the first transistor thereof being connected with its source electrode to the one supply voltage U3 while the second output 2 of the driver stage Ss is connected to the output of the second CMOS inverter, with the second transistor thereof being connected with its source electrode to the other supply voltage U0 of the driver stage. Since, to the first CMOS inverter as shown in FIG. 5b, there is applied the supply voltage U3−U2, the corresponding voltage of the second CMOS inverter is U1−U0. On the righthand side next to the circuit diagram of FIG. 5b there is shown an example of embodiment adapted to the practice of programming non-volatile programmable memory transistors, showing the voltages 0=0, U1=5V, U2=15V and U3=20V. In the table of FIG. 5c there are shown the output voltages $u_{O1}$ and $u_{23}$ relating to the two input voltages $u_{O3}$ of 0 and 20V. The two driver signals are thus only somewhat larger than the threshold voltages of the respective selectable insulated-gate field-effect transistors of the two CMOS circuits of the driver stage Ss. In this case, too, it can be recognized from the table in FIG. 5c that a channel interrupter region 5 is merely to be provided for below the stripline connecting the gate electrodes, i.e., between the two substrate regions 6 and 7.

Accordingly, the insertion of a third supply voltage U2 is decisive for operating a driver stage Ss according to FIG. 5. This is connected to the p-doped substrate region 8 and the source region of the n-channel fieldeffect transistor as accommodated therein. The p-doped substrate region 8, in turn, is let into the n-doped substrate region 7 which is connected to the supply voltage U3 and the source region of a p-channel field-effect transistor as arranged therein. Both field-effect transistors form the first inverter with the first output 1.

The p-channel field-effect transistor of the second CMOS inverter is accommodated in the next n-doped substrate region 6 while the regions of its n-channel field-effect transistor are diffused directly into the p-doped substrate.

FIG. 6 illustrates how the level conversion stage Pu according to FIG. 3 can be realized. This stage whose corresponding circuit diagram is shown in FIG. 6b, effects the level conversion of the signal $u_{O1}'$ to $u_{O3}$, with the capacitive load for $u_{O3}$ still being kept very small in this particular case, because there is not yet to be processed any power as in the output stage according to FIG. 4. The level conversion stage is realized by using two subsequently arranged inverters, with the first one thereof being connected to the supply voltage U1, and with the second one thereof being connected to the supply voltage U3. These two inverter stages, according to FIG. 6a showing a cross sectional view in the usual representation of the level conversion stage, are realized by employing two substrate regions 8 and 9 of the first conductivity type which are inserted into the plate-shaped substrate body 3 of the respective other conductivity type. In the case of the p-channel field-effect transistor of the subsequently arranged inverter disposed in the substrate region 10 and which, with its source region, is connected to the supply voltage U3, an increased threshold voltage $U_T{}^*$ must be realized by way of ion implantation in the channel area 11, i.e., in such a way that the relationship as shown in FIG. 6 will apply;

$$U3 - U1 < |U_T{}^*| < U3.$$

The table 6c shows the dependency of the output level $u_{O3}$ and of the level $u_{O1}$ upon the level of the input signal $u_{O1}$ with respect to the conditions as shown next to the table.

It is possible without further ado, to subject the low-level driver signals to a logical operation for which purpose, for example, it is possible to use the inverter as shown in FIG. 7 whose circuit diagram is shown in FIG. 7b and whose monolithic integrated realization can be easily seen from FIG. 7a. In that case, however, compared to the logical operation prior to the splitting of the digital input signal into the two driver signals, there is required double the investment in circuitry. Yet, it is possible in this way, to achieve under certain circumstances, advantages in design and/or power dissipation savings. Moreover, the increased investment in circuitry is partly compensated in that only a small number of channel interrupter regions are required.

Figure 8:
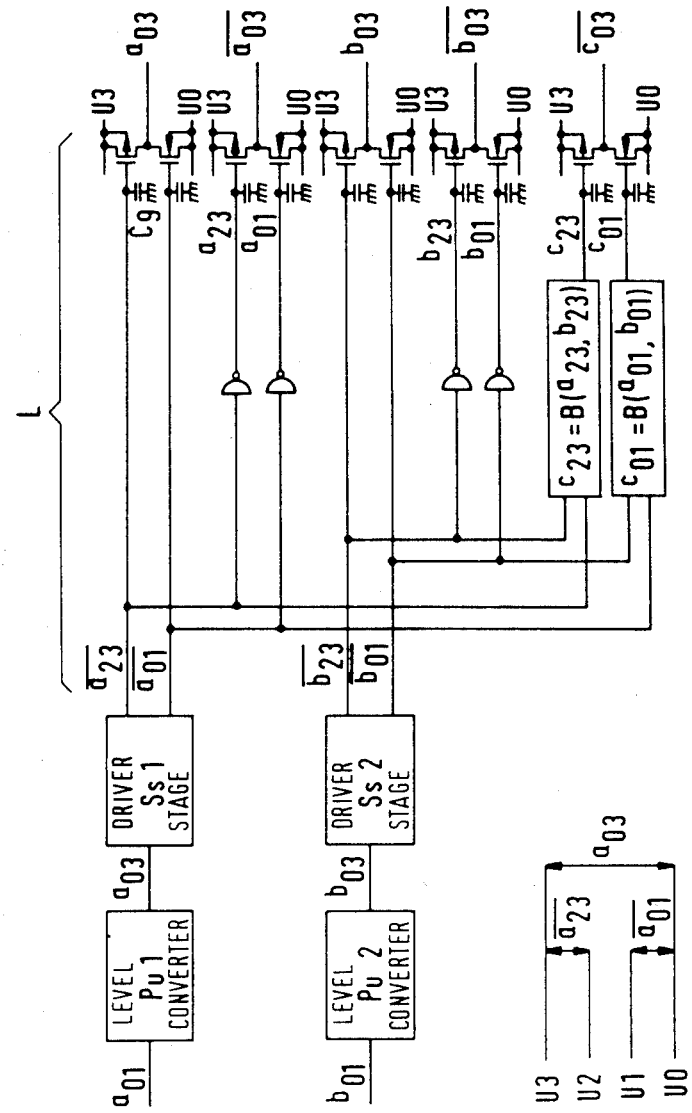
FIG. 8 shows a basic circuit diagram serving to explain the logical operation of the driver signals.

By way of a block diagram it is shown in FIG. 8, in what way two control signals $a_{O1}$ and $b_{O1}$—and accordingly on principle also several control signals—can be subjected to a logical operation subsequently to the splitting thereof. The splitting is effected with the aid of the two driver stages Ss1 and Ss2 following a level conversion in Pu1 or Pu2 respectively. The split signals $c_{23}$ and $c_{O1}$ may be any Boolean functions B of $a_{23}$ and $b_{23}$ or of $a_{O1}$ and $b_{O1}$, as can be seen from FIG. 8. Throughout the area L there is saved by the signal spliting, a considerable amount of drive power. Compared with a logical operation without a splitting of the input signal into two driver signals, of course, there is required double the investment in circuitry when the driver signals are subjected to a logical operation. Yet, in the way as explained in FIG. 8, it is possible under certain circumstances, to obtain design advantages, for example a saving of surface area, by doing without the channel interrupter regions and/or power dissipation savings.

Figure 9:
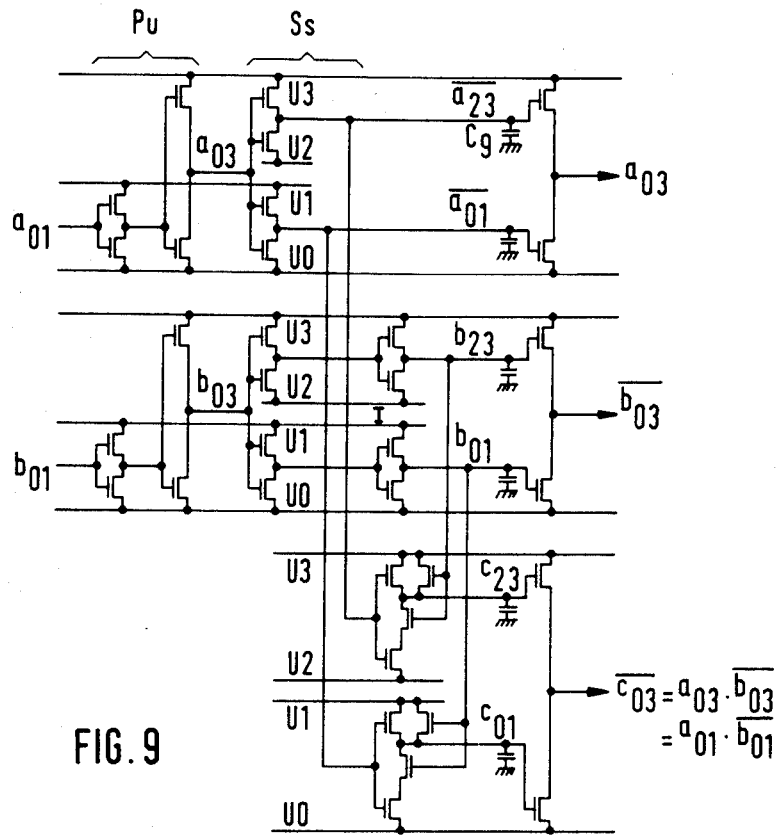
FIG. 9 shows the circuit of a logical element designed according to FIG. 8.

Since, from FIG. 8, the advantages of a logical operation of the split signals will be easily understood by the person skilled in the art, it is deemed sufficient to describe the circuit details of such logical operations with reference to a simple example as shown in FIG. 9.

Figure 10:
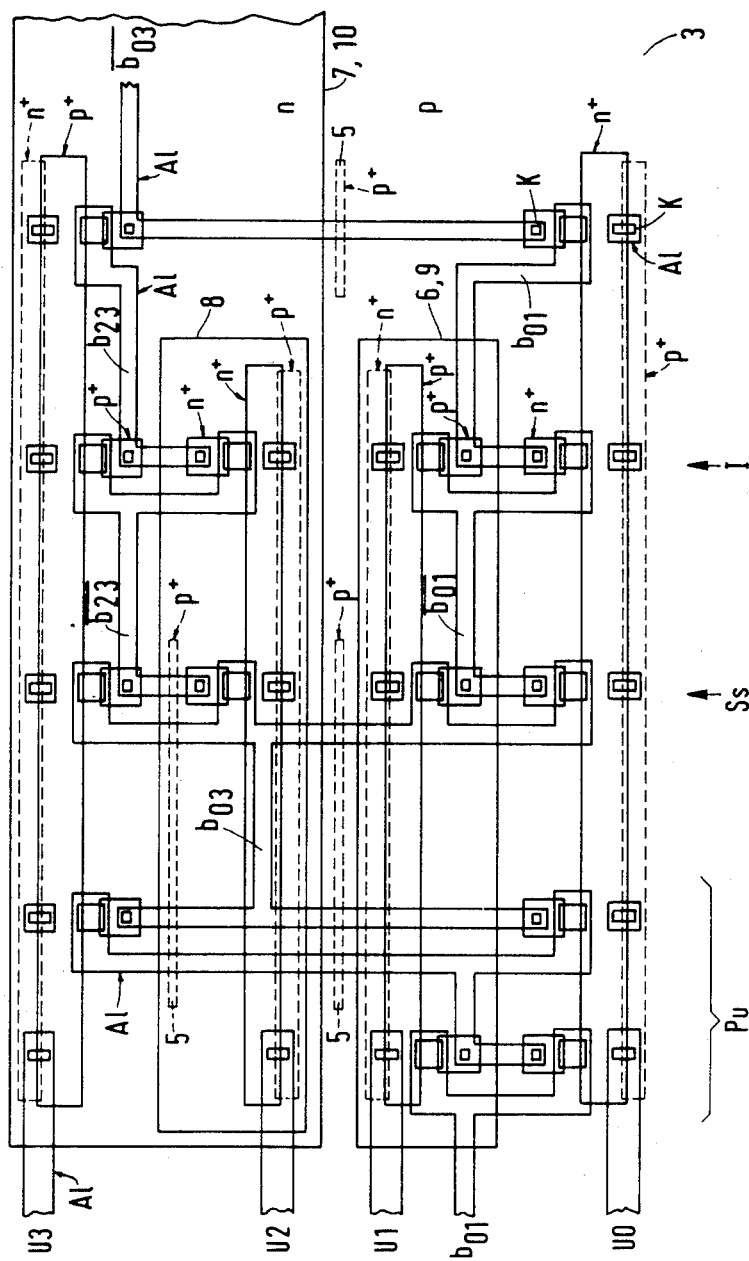
FIG. 10, in a top view, shows one example of embodiment relating to a part of the logic element according to FIG. 9.

From the circuit of FIG. 9 it can be seen how, with the aid of two level converters Pu according to FIG. 6 and two driver stages Ss as shown in FIG. 7, two input signals $a_{O1}$ and $b_{O1}$ can be changed into two driver signals $a_{23}$ and $a_{O1}$ or $b_{23}$ and $b_{O1}$, and used for driving each time one power stage at the output of which the signal $a_{O3}$ or the signal $b_{O3}$ can be taken off. Ahead of the power stage at which the output signal $b_{O3}$ is taken off, there is arranged an inverter stage as shown in FIG. 7. Moreover, for obtaining an output signal $c_{O3} = a_{O3} \cdot b_{O3}$, there is provided a NOR gate stage, to the first NOR gate of which there are fed the two signals $a_{O1}$ and $b_{O1}$, and to the second NOR gate of which there are applied the two signals $a_{23}$ and $b_{23}$ according to the table shown below the circuit in FIG. 9. The field-effect transistors positioned above the output taps are p-channel field-effect transistors while those arranged below the output taps are n-channel field-effect transistors. This example of embodiment according to FIG. 9 shows that the split driver signals can be subjected arbitrarily to a logical operation in that the potentially high driver signals and the potentially low driver signals are respectively subjected separately to the logical operation. The thus obtained pairs of output signals are then applied to each time one gate electrode of the complementary insulated-gate field-effect transistors of the power stage. FIG. 10 shows the embodiment of the center part of the circuit of FIG. 9 to which the input signal $b_{O1}$ is applied and which, ahead of the power stage, contains an inverter as shown in FIG. 7. The striplines as well as the gate electrodes of the field-effect transistors consist of aluminum (AL). Into the surface side of the p-doped substrate body 3, for the purpose of realizing the center part of the circuit according to FIG. 9, there is inserted the n-doped substrate region 7 which corresponds to the substrate region 7 as shown in FIGS. 5 and 7. This substrate region 7 is designed to form one piece with the substrate region 10 of FIG. 6. Into this substrate region 7, in turn, there is inserted the further substrate region 8 which corresponds to the substrate region 8 as shown in FIGS. 5 and 7. The source regions of the upper p-channel field-effect transistors and of the lower n-channel field-effect transistors are designed in one piece in the form of a p+-doped region strip or else in the form of a n+-doped region strip, as can be easily recognized from FIG. 10. Moreover, into the surface of the p-doped substrate body there is inserted the substrate region 6, 9.—cf. FIGS. 5, 6 and 7. Moreover, the spacings between the transistors as shown in FIG. 10 have been enlarged for the sake of clarity.

As can be seen from FIG. 10, p+-doped channel interrupter regions 5 are not required below the striplines for the partial signals indicated by the indices O1 and O3, provided that these striplines are each conducted within their associated n-doped substrate regions. This results in the advantage of a saving of surface area which, however, is not quite easily to be seen from FIG. 10, because the spacings, as already mentioned hereinbefore, have been enlarged for the sake of clarity. Moreover, the saving of surface area only becomes really noticeable in the case of long signal lines which are often needed in practical cases.

Finally, it is still to be noted that some of the contacts of the Al-striplines together with the semiconductor material exposed therebelow are indicated in FIG. 10 by the letter K.

What is claimed is:

1. An integrated CMOS circuit, comprising: a power stage in the form of a source-drain drain-source series circuit of two complementary channel type insulated-gate field-effect transistors which are each arranged in a substrate region with the source regions of the field-effect transistors to each of which is applied one of two supply potentials, an output signal being taken from the node connecting the two drain regions of said field-effect transistors, and gate electrodes for simultaneously receiving two driver signals; a driver stage for splitting up a digital input signal into two driver signals of the same phase, which simultaneously appear at respective ones of two outputs, said gate electrode of said field-effect transistor supplied with one of the supply voltages connected to the first output of the driver stage, said gate electrode of said field-effect transistor supplied with the other of said supply voltages connected to the second output of said driver stage, whereby the driver signals raise the source-gate voltage of one of said two field-effect transistors above its threshold voltage value, wherein said driver stage comprises two CMOS inverters each with a pair of complementary insulated-gate field-effect transistors, to the gate electrodes of which the digital input signal is applied, that the first output of said driver stage is connected to the output of the first CMOS inverter whose first transistor is connected at its source electrode to the one supply voltage and whose second transistor is connected at its source electrode to an intermediate supply voltage, that the second output of said driver stage is connected to the output of the second CMOS inverter whose second transistor is connected with its source electrode to the other supply voltage and whose first transistor is connected at its source electrode to another intermediate supply voltage, and to said two CMOS inverters there is applied one supply voltage which is higher than the threshold voltage of the respective insulated-gate field-effect transistors of the CMOS power stage circuit which are to be controlled, a further driver stage for rceiving a further digital input signal and a logic element, one driver signal of said driver stage together with a driver signal of the further driver stage being applied to an input of the logic element, with an output of the logic element being connected to one gate electrode of the complementary insulated-gate field-effect transistors of said power stage.

2. An integrated CMOS circuit, comprising: a power stage in the form of a source-drain drain-source series circuit of two complementary channel type insulated-gate field-effect transistors which are each arranged in a substrate region with the source regions of the field-effect transistors to each of which is applied one of two supply potentials, an output signal being taken from the node connecting the two drain regions of said field-effect transistors, and gate electrodes for simultaneously receiving two driver signals; a driver stage for splitting up a digital input signal into two driver signals of the same phase, which simultaneously appear at respective ones of two outputs, said gate electrode of said field-effect transistor supplied with one of the supply voltages connected to the first output of the driver stage, said gate electrode of said field-effect transistor supplied with the other of said supply voltages connected to the second output of said driver stage, whereby the driver signals raise the source-gate voltage of one of said two field-effect transistors above its threshold voltage value, wherein said driver stage comprises two CMOS inverters each with a pair of complementary insulated-gate field-effect transistors, to the gate electrodes of which the digital input signal is applied, that the first output of said driver stage is connected to the output of the first CMOS inverter whose first transistor is connected at its source electrode to the one supply voltage and whose second transistor is connected at its source electrode to an intermediate supply voltage, that the second output of said driver stage is connected to the output of the second CMOS inverter whose second transistor is connected with its source electrode to the other supply voltage and whose first transistor is connected at its source electrode to another intermediate supply voltage, and to said two CMOS inverters there is applied one supply voltage which is higher than the threshold voltage of the respective insulated-gate field-effect transistors of the CMOS power stage circuit which are to be controlled, and a level converter including a CMOS inverter stage and a CMOS preinverter stage, the input of said driver stage being connected to the output of the CMOS inverter stage and the input of said CMOS inverter stage being connected to the output of the CMOS preinverter stage, wherein a low-level digital input signal is applied to the input of said CMOS preinverter stage and from the output of said CMOS inverter stage there is obtained said digital input signal for said driver stage, said digital input signal being at a higher signal level than said low-level digital input signal to said CMOS inverter stage there is applied a supply voltage which is higher than the supply voltage of said CMOS preinverter stage and the magnitude of the threshold voltage of one transistor of a pair of CMOS transistors comprising said CMOS inverter stage is adjusted to be within the range of voltages between the CMOS preinverter stage supply voltage and the CMOS inverter stage supply voltage.

* * * * *